US012744095B2

(12) United States Patent
Xiang et al.

(10) Patent No.: US 12,744,095 B2
(45) Date of Patent: Sep. 22, 2026

(54) MEMORY DEVICE AND OPERATION METHOD THEREOF

(71) Applicant: Yangtze Memory Technologies Co., Ltd., Wuhan (CN)

(72) Inventors: Li Xiang, Wuhan (CN); Ke Liang, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 105 days.

(21) Appl. No.: 18/783,124

(22) Filed: Jul. 24, 2024

(65) Prior Publication Data

US 2025/0349373 A1 Nov. 13, 2025

Related U.S. Application Data

(63) Continuation of application No. PCT/CN2024/092565, filed on May 11, 2024.

(51) Int. Cl.
*G11C 16/34* (2006.01)
*G11C 16/04* (2006.01)
*G11C 16/10* (2006.01)

(52) U.S. Cl.
CPC ...... *G11C 16/3459* (2013.01); *G11C 16/0483* (2013.01); *G11C 16/10* (2013.01)

(58) Field of Classification Search
CPC . G11C 16/3459; G11C 16/0483; G11C 16/10; G11C 16/3427; G11C 2211/5621
See application file for complete search history.

(56) References Cited

U.S. PATENT DOCUMENTS

| | | | | |
|---|---|---|---|---|
| 6,108,238 | A * | 8/2000 | Nakamura | G11C 16/3454 365/185.17 |
| 10,210,941 | B1 * | 2/2019 | Chen | G11C 16/10 |
| 11,270,776 | B1 * | 3/2022 | Lien | G11C 16/24 |
| 11,875,043 | B1 * | 1/2024 | Zainuddin | G06F 3/0679 |
| 2013/0322174 | A1 * | 12/2013 | Li | G11C 29/028 365/185.24 |
| 2014/0233316 | A1 | 8/2014 | Shim et al. | |
| 2018/0137925 | A1 * | 5/2018 | Nam | G11C 16/28 |
| 2022/0189566 | A1 | 6/2022 | Lee et al. | |

(Continued)

OTHER PUBLICATIONS

International Search Report in International Appln. No. PCT/CN2024/092565, mailed on Sep. 3, 2024, 3 pages.

*Primary Examiner* — Jay W. Radke
(74) *Attorney, Agent, or Firm* — Fish & Richardson P.C.

(57) ABSTRACT

Methods, devices, and systems for managing memory devices are provided. In one aspect, a memory device can include a memory array and a peripheral circuit. The memory array can include a first and a second memory string. The peripheral circuit is configured to perform a first verification operation during a first loop of a program operation to program the first memory string. During a pre-pulse phase of the first verification operation, a pass voltage is applied to a first select line coupled to first select gate transistor of the second memory string for a first duration. The peripheral circuit is configured to perform a second verification operation during a second loop of the program operation that is after the first loop. During a pre-pulse phase of the second verification operation, a pass voltage is applied to the first select line for a second duration shorter than the first duration.

20 Claims, 12 Drawing Sheets

1000

(56) References Cited

U.S. PATENT DOCUMENTS

2022/0199162 A1* 6/2022 Kim .................... G11C 16/08
2022/0199175 A1 6/2022 Lu et al.
2023/0015493 A1* 1/2023 Jung .................... G11C 16/10
2024/0221836 A1* 7/2024 Lee .................... G11C 11/5671

* cited by examiner

| Pulse | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 |
|---|---|---|---|---|---|---|---|---|---|---|---|---|---|---|---|---|---|---|---|---|---|---|---|
| P1 | V | V | V | V | V | V | V | V | | | | | | | | | | | | | | | |
| P2 | | | | | | | V | V | V | V | V | | | | | | | | | | | | |
| P3 | | | | | | | | | V | V | V | V | V | | | | | | | | | | |
| P4 | | | | | | | | | | | V | V | V | V | V | | | | | | | | |
| P5 | | | | | | | | | | | | | V | V | V | V | V | V | | | | | |
| P6 | | | | | | | | | | | | | | | | V | V | V | V | V | | | |
| P7 | | | | | | | | | | | | | | | | | | | V | V | V | V | |

MEMORY DEVICE AND OPERATION METHOD THEREOF

CROSS-REFERENCE TO RELATED APPLICATIONS

This application is a continuation of International Application No. PCT/CN2024/092565, filed on May 11, 2024, the disclosure of which is hereby incorporated by reference in its entirety.

TECHNICAL FIELD

The present disclosure generally relates to memory devices and memory systems, and in particular, to managing program time in memory devices.

BACKGROUND

Flash memory is a low-cost, high-density, nonvolatile solid-state storage medium that can be electrically erased and reprogrammed. Flash memory includes NOR flash memory and NAND flash memory. Various operations can be performed by flash memory, for example, program (write) and erase operations, to change the threshold voltage of each memory cell to a respective level. For NAND flash memory, an erase operation can be performed at the block level, a program operation can be performed at the page level, and a read operation can be performed at the page level.

SUMMARY

The present disclosure involves methods, apparatuses, and systems for managing program time in memory devices. In one example, a memory device can include a memory array and a peripheral circuit coupled to the memory array. The memory array can include a first memory string and a second memory string. The first memory string includes first memory cells. The second memory string includes a first select gate transistor coupled to a first select line, a second select gate transistor, and second memory cells positioned between the first select gate transistor and the second select gate transistor. The peripheral circuit is configured to perform operations including performing, during a first loop of a program operation to program the first memory string, a first verification operation. Performing the first verification operation includes during a first pre-pulse phase, applying, for a first duration, a pass voltage to the first select line. The peripheral circuit is configured to perform operations including performing, during a second loop of the program operation, a second verification operation. Performing the second verification operation includes during a second pre-pulse phase, applying, for a second duration, the pass voltage to the first select line. The second loop is after the first loop, and the second duration is shorter than the first duration.

In some implementations, the first memory string is a selected memory string, the second memory string is an unselected memory string, the first select gate transistor is a drain select gate transistor, the second select gate transistor is a source select gate transistor, and the first select line is a drain select line.

In some implementations, performing the first verification operation includes during a first sense phase, verifying whether a first memory cell of the first memory cells is in a first programmed state. Performing the second verification operation includes during a second sense phase, verifying whether a second memory cell of the first memory cells is in a second programmed state. The first programmed state is lower than the second programmed state.

In some implementations, the operations include performing, during a third loop of the program operation, a third verification operation. Performing the third verification operation includes during a third pre-pulse phase, applying, for a third duration, the pass voltage to the first select line. The third loop is after the second loop, and the third duration is shorter than the second duration.

In some implementations, performing the third verification operation includes during a third sense phase, verifying whether a third memory cell of the first memory cells is in a third programmed state. The third programmed state is higher than the second programmed state.

In some implementations, the first memory cells are triple-level cells programmable to one of seven programmed states P1, P2, P3, P4, P5, P6 and P7 in an ascending order. The first programmed state includes one of P1, P2 or P3, the second programmed state includes one of P4 or P5, and the third programmed state includes one of P6 or P7.

In some implementations, the operations include performing, during a third loop of the program operation, a third verification operation without a pre-pulse phase before verifying whether a third memory cell of the first memory cells is in a third programmed state.

In some implementations, performing the first verification operation includes in response to determining that the first programmed state is lower than a first threshold state, applying the pass voltage to the first select line for the first duration. Performing the second verification operation includes in response to determining that the second programmed state is higher than or equal to the first threshold state and lower than a second threshold state, applying the pass voltage to the first select line for the second duration.

In some implementations, performing the second verification operation includes after applying a first verify voltage to a first word line coupled to the second memory cell of the first memory cells, applying a second verify voltage to the first word line. The second verify voltage is higher than the first verify voltage.

In some implementations, performing the first verification operation includes, during the first sense phase, applying a ground voltage to the first select line.

In some implementations, the first memory string includes a third select gate transistor and a fourth select gate transistor. The first memory cells are positioned between the third select gate transistor and the fourth select gate transistor. The first verification operation includes during the first pre-pulse phase and the first sense phase, applying a pass voltage to a second select line coupled to the third select gate transistor of the first memory string.

In some implementations, the second select gate transistor of the first memory string and the fourth select gate transistor of the second memory string are coupled to a third select line. Performing the first verification operation includes during the first pre-pulse phase, applying a pass voltage to the third select line.

In some implementations, performing the first verification operation includes during the first pre-pulse phase and the first sense phase, applying a third verify voltage corresponding to the first programmed state to a second word line coupled to the first memory cell of the first memory cells.

One aspect of the present disclosure features a method of operating a memory device. The method includes performing, during a first loop of a program operation to program a first memory string including first memory cells, a first verification operation. Performing the first verification operation includes during a first pre-pulse phase, applying, for a first duration, a pass voltage to a first select line coupled to a first select gate transistor of a second memory string. The second memory string includes the first select gate transistor, a second select gate transistor, and second memory cells positioned between the first select gate transistor and the second select gate transistor. The method further includes performing, during a second loop of the program operation, a second verification operation. Performing the second verification operation includes during a second pre-pulse phase, applying, for a second duration, the pass voltage to the first select line. The second loop is after the first loop, and the second duration is shorter than the first duration.

In some implementations, performing the first verification operation includes during a first sense phase, applying a first verification voltage to a first word line coupled to a first memory cell of the first memory cells. Performing the second verification operation includes during a second sense phase, applying a second verification voltage to a second word line coupled to a second memory cell of the first memory cells. The first verification voltage is lower than the second verification voltage.

In some implementations, performing the first verification operation includes in response to determining that a first programmed state corresponding to the first verification voltage is lower than a first threshold state, applying the pass voltage to the first select line for the first duration. Performing the second verification operation includes in response to determining that a second programmed state corresponding to the second verification voltage is higher than or equal to the first threshold state and lower than a second threshold state, applying the select voltage to the first select line for the second duration.

In some implementations, the method includes performing, during a third loop of the program operation, a third verification operation. Performing the third verification operation includes during a third pre-pulse phase, applying, for a third duration, the select voltage to the first select line. The third loop is after the second loop, and the third duration is shorter than the second duration.

In some implementations, performing the third verification operation includes during a third sense phase, applying a third verification voltage to a third word line coupled to a third memory cell of the first memory cells. The third verification voltage is higher than the second verification voltage.

In some implementations, the method includes performing, during a third loop of the program operation, a third verification operation without a pre-pulse phase before a third sense phase.

One aspect of the present disclosure features a memory system. The memory system includes a memory device and a memory controller coupled to the memory device and configured to send signals to the memory device. The memory device includes a memory array and a peripheral circuit coupled to the memory array. The memory array includes a first memory string and a second memory string. The first memory string includes first memory cells. The second memory string includes a first select gate transistor coupled to a first select line, a second select gate transistor, and second memory cells positioned between the first select gate transistor and the second select gate transistor. The peripheral circuit is configured to perform operations including performing, during a first loop of a program operation to program the first memory string, a first verification operation. Performing the first verification operation includes during a first pre-pulse phase, applying, for a first duration, a select voltage to the first select line. The peripheral circuit is configured to perform operations including performing, during a second loop of the program operation, a second verification operation. Performing the second verification operation includes during a second pre-pulse phase, applying, for a second duration, the select voltage to the first select line. The second loop is after the first loop, and the second duration is shorter than the first duration.

While generally described as computer-implemented software embodied on tangible media that processes and transforms the respective data, some or all of the aspects may be computer-implemented methods or further included in respective systems or other devices for performing this described functionality. The details of these and other aspects and implementations of the present disclosure are set forth in the accompanying drawings and the description below. Other features, objects, and advantages of the disclosure will be apparent from the description and drawings, and from the claims.

BRIEF DESCRIPTION OF DRAWINGS

Like reference numbers and designations in the various drawings indicate like elements.

DETAILED DESCRIPTION

Figure 1:
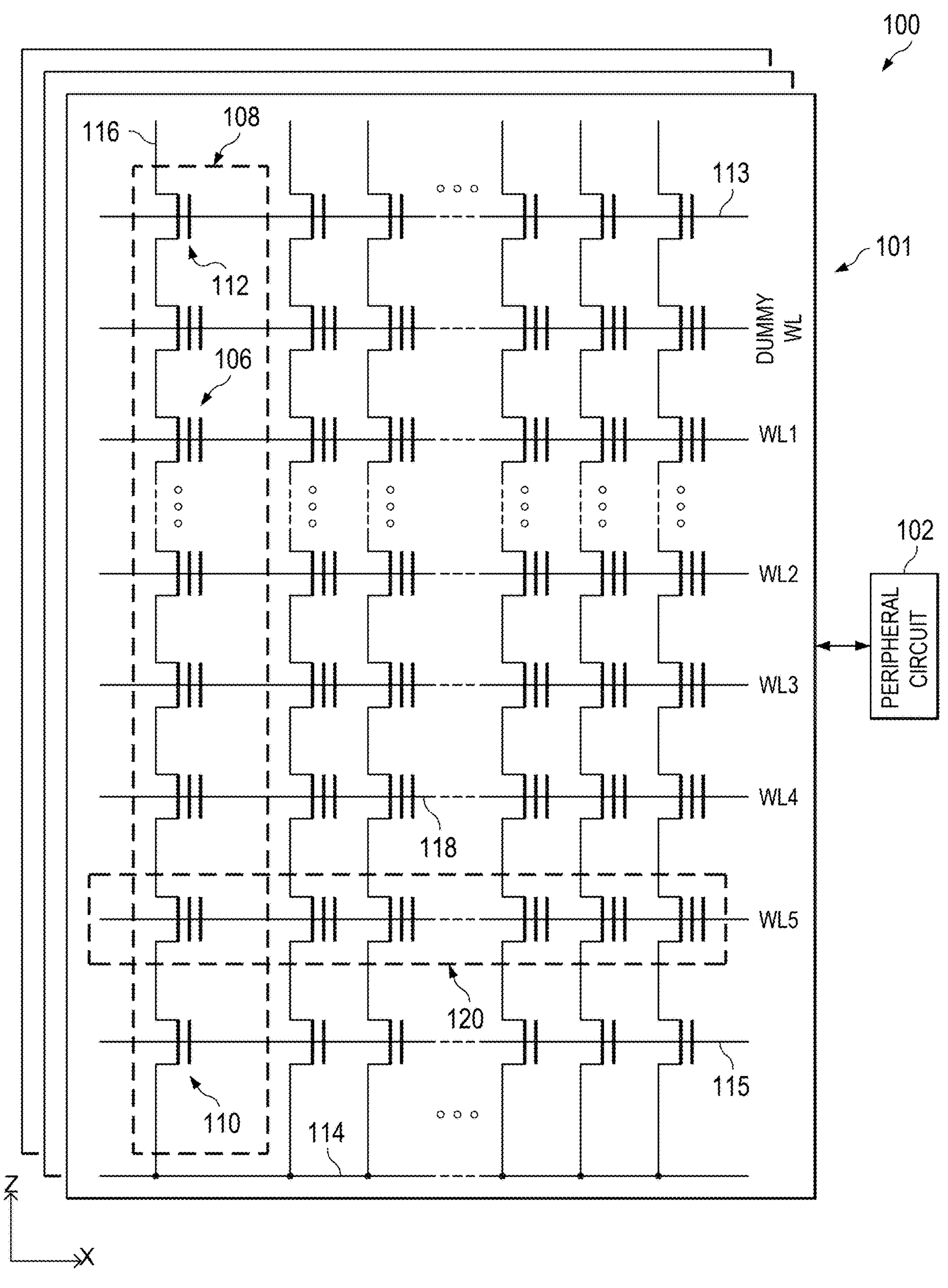
FIG. 1 illustrates an example of a schematic diagram of a memory device including peripheral circuits, according to some aspects of the present disclosure.

This specification relates to memory devices, memory systems, and methods for managing program time in NAND flash memory. During a program operation (also referred to as a programming operation) that programs memory cells in a selected memory string, hot carrier injection (HCl) effect may occur in an unselected memory string, where electrons are injected into memory cells that are not selected for programming. For example, during a verification operation of the program operation, since drain select gate (DSG) transistor and source select gate (SSG) transistor of the unselected memory string are both switched off, the verification voltage applied on a word line may cause a large voltage difference in the channel of the unselected memory string. The large voltage difference may cause electrons being injected into memory cells in the unselected memory string, thereby changing the threshold voltage of the memory cells. To mitigate the HCl effect, a pre-pulse phase can be included at the beginning of the verification operation. An unselected memory string can be pre-pulsed during the pre-pulse phase, for example, by being applied a pre-pulse voltage (e.g., Vpass). In some implementations, DSG transistor and SSG transistor of the unselected memory string are both switched on during the pre-pulse phase, so that the channel potential of the unselected memory string can be set to ground voltage. As such, the pre-pulse phase of the verification operation can mitigate the HCl effect caused by large voltage difference in the channel of the unselected memory.

In some implementations, all of the unselected memory strings in the same block as the selected memory string are pre-pulsed during the pre-pulse phase. In some other implementations, unselected memory strings in the same finger as the selected memory string are pre-pulsed during the pre-pulse phase, while memory strings in unselected fingers are not pre-pulsed. This can mitigate the coupling effect by unselected memory strings on the selected word line, thereby reducing the time to establish voltages on the selected word line.

Program time can refer to time spent or needed to perform a program operation. In some implementations, program time can increase due to the time needed for a pre-pulse phase for each verification operation during the program operation. This present disclosure provides techniques to manage program time in a memory device. In some implementations, instead of setting the same duration for pre-pulse phases of different verification operations that verify different programmed states, the duration of pre-pulse phases can vary based on the programmed states to be verified in the respective verification operations. For example, since memory cells in low programmed states (e.g., P1, P2 and P3 of triple-level cells (TLCs)) are more sensitive to HCl effect, a verification operation that verifies a low programmed state can have a long pre-pulse phase. Memory cells in middle programmed states (e.g., P4, P5 of TLCs) can be less sensitive to HCl effect than the memory cells in a low programmed state. Therefore, a verification operation that verifies a middle programmed state can have a shorter pre-pulse phase. Memory cells in high programmed states (e.g., P6, P7 of TLCs) can be even less sensitive to HCl effect. Therefore, a verification operation that verifies a high programmed state can have an even shorter pre-pulse phase, or may not include a pre-pulse phase. As such, by shortening the duration of pre-pulse phases (also referred to as a pre-pulse duration) in verification operations that verify middle and high programmed states, total time needed to perform a program operation can be reduced, and an efficiency of the memory device can be improved. In some implementations, each programmed state of a xLC can have a different pre-pulse duration, where xLC includes a multi-level cell (MLC), a triple-level cell (TLC), a quad-level cell (QLC), or a higher-level cell. In some implementations, programmed states of a xLC can be divided into multiple groups, as the example described above, and different groups have different pre-pulse durations, while each programmed state in a same group shares the same pre-pulse duration.

In some implementations, the pre-pulse durations for different programmed states can be determined based on edge summation (Esum) performance of the resulting programmed states. As an example, experiments can be performed to determine relationships of Esum relative to different pre-pulse durations, and specific pre-pulse durations for each programmed state (and/or the grouping of the programmed states) can be determined based on the relationships, for example, to maintain the same or slightly degraded (within a certain threshold) Esum performance compared to scenarios where uniform pre-pulse durations for different programmed states are applied.

In some implementations, the described techniques can achieve one or more technical effects. For example, the described techniques can balance the Esum performance and the program time of a memory device. For another example, varying pre-pulse durations for different programmed states can be achieved without hardware changes. As such, the described techniques are easy to implement without needing extra die size or incurring additional cost. In some implementations, additional or different technical effects can be achieved.

FIG. 1 illustrates an example of a schematic circuit diagram of a memory device 100 including peripheral circuits, according to some aspects of the present disclosure. The memory device 100 can include a memory array 101 and peripheral circuits 102 coupled to the memory array 101. The memory array 101 can be a NAND Flash memory array further includes one or more blocks. Memory cells 106 are provided in the form of an array of cell strings 108 each extending vertically (e.g., along z direction) above a substrate (not shown in FIG. 1). In some implementations, each cell string 108 includes a plurality of memory cells 106 coupled in series and stacked vertically. Each memory cell 106 can hold a continuous, analog value, such as an electrical voltage or charge that depends on the number of electrons trapped within a storage layer of the memory cell 106. The logic state (i.e., data) of each memory cell 106 can be determined based on the threshold voltage Vth of the memory cell 106. Each memory cell 106 can be a floating gate type memory cell including a floating-gate transistor, or a charge trap type memory cell including a charge-trap transistor.

In some implementations, each memory cell 106 is a single-level cell (SLC) with two possible memory states that can store one bit of data. For example, the first memory state "0" (e.g., erased state) can correspond to a first range of voltages, and the second memory state "1" (e.g., programmed state) can correspond to a second range of voltages. In some implementations, to increase storage capacity, each memory cell 106 can a multi-level cell (MLC), a triple-level cell (TLC), or a quad-level cell (QLC). An MLC stores 2 bits of data, and has four logic states, logic {11, 10, 01, and 00}, i.e., erased state, and programmed states P1, P2, and P3. A TLC stores 3 bits of data, and has eight logic states, logic {111, 110, 101, 100, 011, 010, 001, 000}, i.e., erased state, and programmed states P1-P7. A QLC stores 4 bits of data and has 16 logic states, logic {1111, 1110, 1101, 1100, 1011, 1010, 1001, 1000, 0111, 0110, 0101, 0100, 0011, 0010, 0001, 0000}, i.e., erased state and programmed states P1-P15.

As shown in FIG. 1, each cell string 108 can include a source select gate (SSG) transistor 110 at its source end, and a drain select gate (DSG) transistor 112 at its drain end. The SSG transistor 110 and the DSG transistor 112 can be configured to activate selected strings 108 (columns of the array) during read and program operations. In some implementations, the sources of strings 108 in the same block are coupled through a same source line 114. In other words, strings 108 in the same block have an array common source (ACS), according to some implementations. The drain of each cell string 108 is coupled to a respective bit line 116 from which data can be read or written via an output bus (not shown), according to some implementation. In some implementations, each cell string 108 is configured to be selected or deselected by applying a DSG select voltage or a DSG unselect voltage to the gate of the respective DSG transistor 112 through one or more DSG lines 113, and/or by applying a select voltage or a unselect voltage to the gate of the respective SSG transistor 110 through one or more SSG lines 115.

In some implementations, the memory cells 106 of adjacent strings 108 can be coupled through word lines 118. The word line 118 can select which row of memory cells 106 is affected by read and program operations. In some implementations, the memory cell 106 is a SLC, and each word line 118 is coupled to a physical page 120 of memory cells 106, which is the basic data unit for program operations. The size of one physical page 120 in bits is associated with the number of strings 108 coupled by word line 118 in a block. Each word line 118 can include a gate line coupled to a plurality of control gates (gate electrodes) of a plurality of memory cells 106 in the respective physical page 120. Example word lines shown in FIG. 1 include WL0, WL1, WL2, WL3, WL4, and WL5 that are between DSG line 113 and SSG line 115. In some implementations, the word lines can further include dummy word lines coupled to dummy memory cells.

Peripheral circuits 102 can be coupled to memory array 101 through bit lines 116, word lines 118, source lines 114, SSG lines 115, and DSG lines 113. Peripheral circuits 102 can include any suitable analog, digital, and mixed-signal circuits for facilitating the operations of memory array 101 by applying and sensing voltage signals and/or current signals to and from each target memory cell 106 through bit lines 116, word lines 118, source lines 114, SSG lines 115, and DSG lines 113. Peripheral circuits 102 can include various types of peripheral circuits formed using metal-oxide-semiconductor (MOS) technologies.

Figure 2:
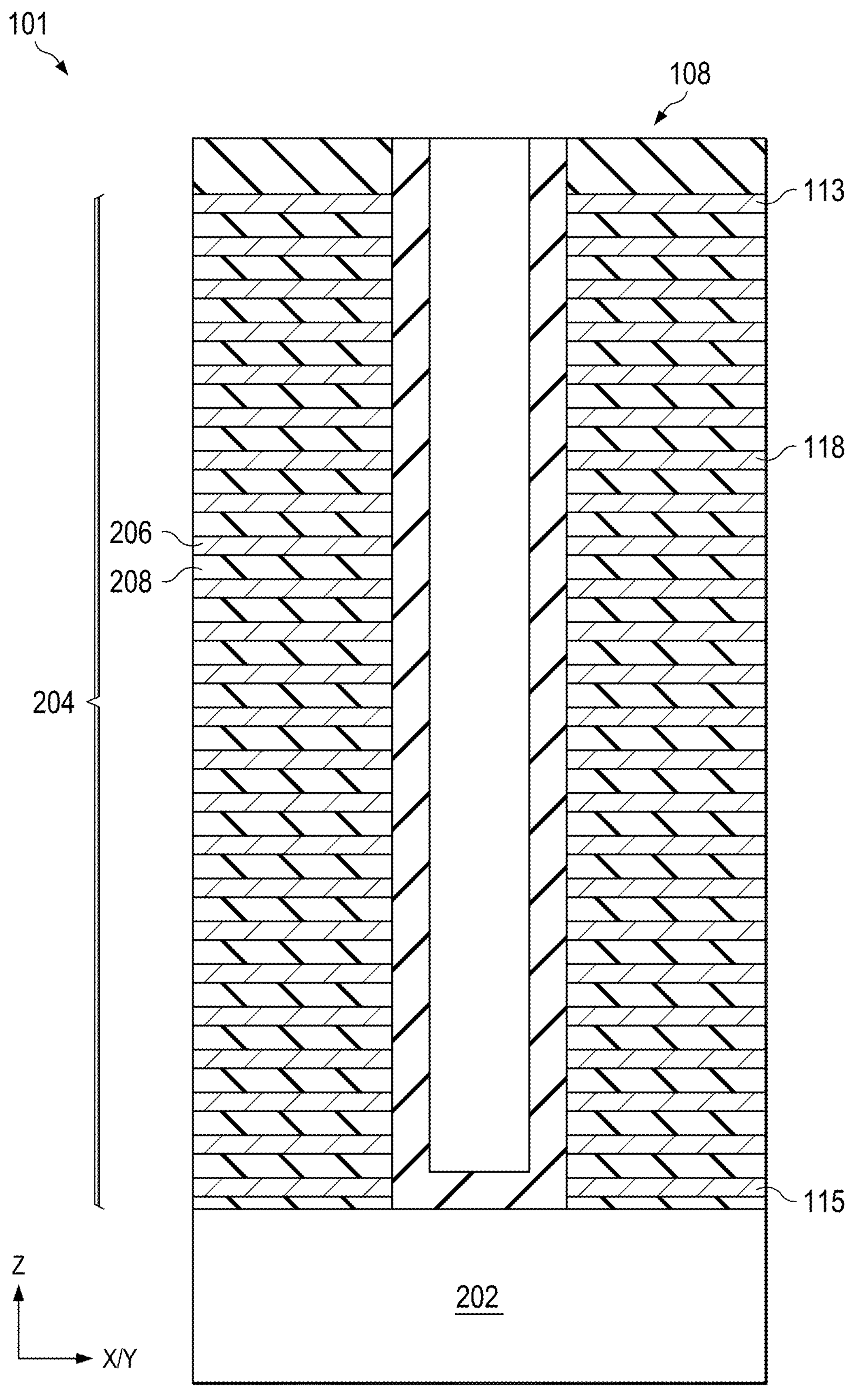
FIG. 2 illustrates an example of a side view of cross-sections of a memory array including memory strings, according to some aspects of the present disclosure.

FIG. 2 illustrates an example of a side view of cross-sections of a memory array 101 including strings 108, according to some aspects of the present disclosure. As shown in FIG. 2, the cell string 108 can extend vertically through a memory stack 204 above a substrate 202. The substrate 202 can include silicon (e.g., single crystalline silicon), silicon germanium (SiGe), gallium arsenide (GaAs), germanium (Ge), silicon on insulator (SOI), germanium on insulator (GOI), or any other suitable materials.

The memory stack 204 can include pairs of interleaved gate conductive layers 206 and gate-to-gate dielectric layers 208. The quantity of the pairs of the interleaved gate conductive layers 206 and gate-to-gate dielectric layers 208 in a memory stack 204 can determine the quantity of memory cells 106 in the memory array 101. The gate conductive layer 206 can include conductive materials including, but not limited to, one or more of tungsten (W), cobalt (Co), copper (Cu), aluminum (Al), polysilicon, doped silicon, or silicide. In some implementations, each gate conductive layer 206 includes a metal layer, such as a tungsten layer. In some implementations, each gate conductive layer 206 includes a doped polysilicon layer. Each gate conductive layer 206 can include control gates surrounding the memory cells 106, the DSG transistor 112, or the SSG transistor 110, and can extend laterally as the DSG line 113 at the top of memory stack 204, the SSG line 115 at the bottom of memory stack 204, or the word lines 118 between the DSG line 113 and the SSG line 115.

Figure 3:
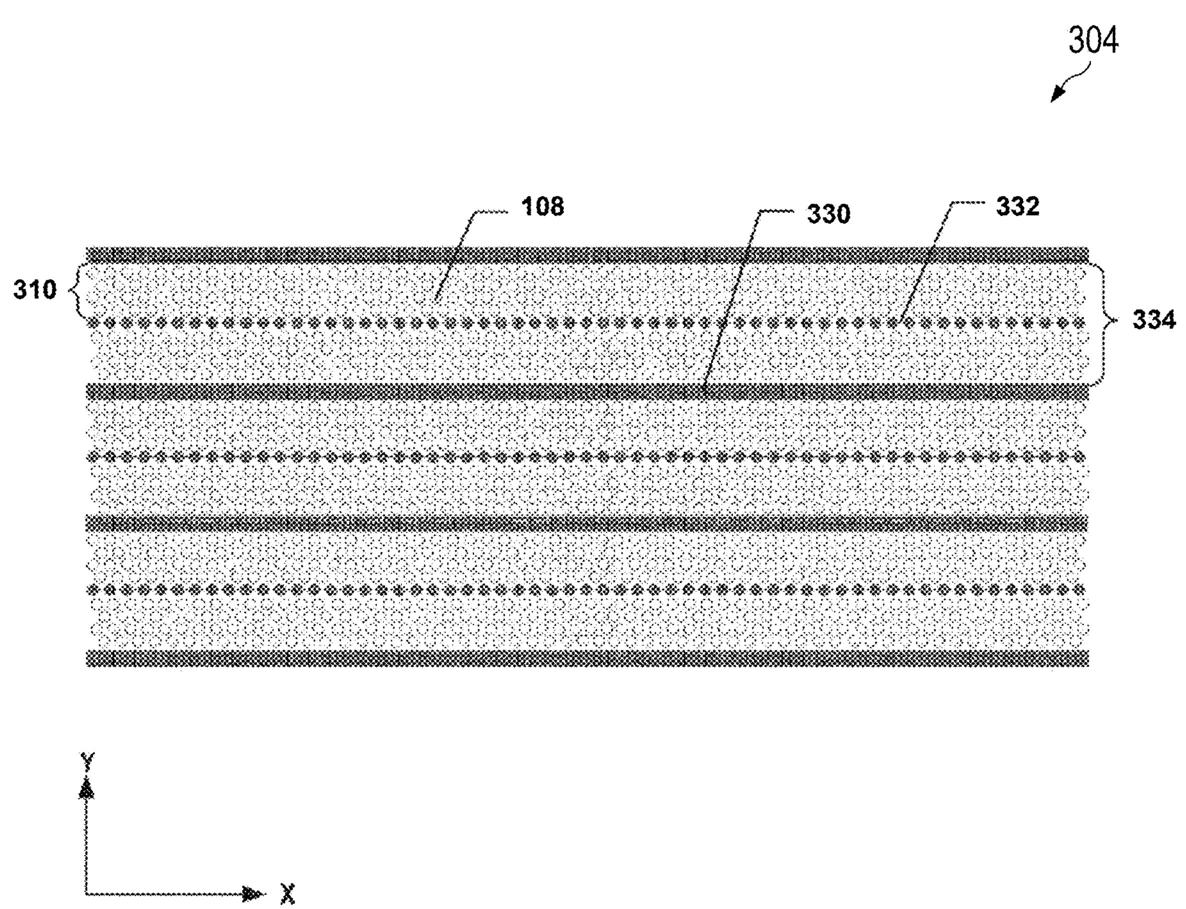
FIG. 3 illustrates an example of a plan view of cross-sections of a block of a memory array, according to some aspects of the present disclosure.

FIG. 3 illustrates an example of a plan view of cross-sections of a block 304 of a memory array (e.g., memory array 101 of FIG. 1), according to some aspects of the present disclosure. In some implementations, each block 304 can serve as a basic data unit for erase operations, such that memory cells 106 on the same block 304 are erased at the same time. To erase memory cells 106 in a selected block 304, the source lines (e.g., source line 114 of FIG. 1) coupled to the selected block 304 and unselected blocks in the same plane can be biased with an erase voltage. For example, the erase voltage can be a high positive voltage (e.g., 20 V or more). In some implementations, an erase operation can be performed at a half-block level, a quarter-block level, or a level having any suitable number of blocks or fractions of a block.

In some implementations, the block 304 can include a plurality of memory strings 310. Each memory string 310 can include one or more cell strings 108. The memory strings 310 are separated between each other by DSG cuts 332, which can electrically separate DSG lines 113 of different memory strings 310, such that each memory string 310 can be individually selected or deselected by applying DSG voltages to respective DSG lines 113. In some implementations, the memory strings 310 can be arranged into fingers 334 by SSG cuts 330, which are electrically separate SSG lines 115 of different fingers 334, such that each finger can be individually selected or deselected by applying SSG voltage to respective SSG lines 115. As an example, as shown in FIG. 3, the block 304 includes three fingers 334 separated by SSG cuts 330, and each finger 334 includes two memory strings 310 separated by DSG cuts 332. In some implementations, a block 304 can include a different number of fingers 334, and each finger 334 can include a different number of memory strings 310.

Figure 4:
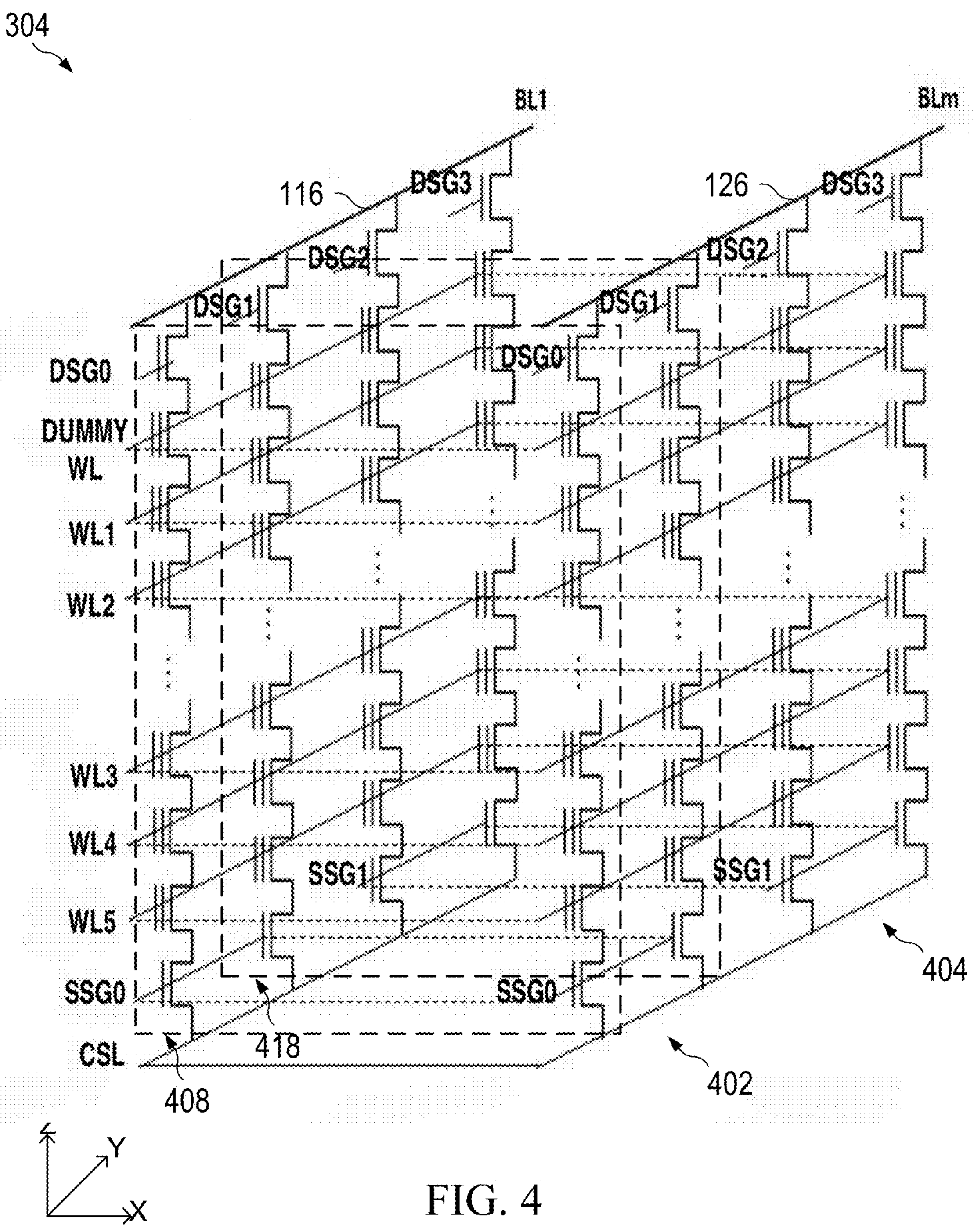
FIG. 4 illustrates an example of a schematic diagram of a memory cell block including memory strings, according to some aspects of the present disclosure.

FIG. 4 illustrates an example of a schematic diagram of a block 304 including memory strings 408, 418 according to some aspects of the present disclosure. In some implementations, block 304 can be divided into fingers 402, 404 (e.g., finger 334 of FIG. 3). SSG transistors 110 of memory strings 408, 418 in the same finger 402, 404 are coupled to the same SSG line 115. For example, as shown in FIG. 4, a first finger 402 includes memory strings 408, 418. SSG transistors 110 of memory string 408, 418 are coupled to a first SSG line represented by SSG0. A second finger 404 includes memory strings each having a SSG transistor 110 that is coupled to a second SSG line represented by SSG1.

In some implementations, each finger 402, 404 can include one or more memory strings 408, 418. DSG transistors 112 in the same memory string 408, 418 are coupled to the same DSG line 113. For example, as shown in FIG.

4, the first finger 402 and the second finger 404 each includes one or more memory strings. A first memory string 408 (which includes a plurality of cell strings 108) in the first finger 402 is coupled to a first DSG line represented by DSG0. A second memory string 418 (which includes a plurality of cell strings 108) in the first finger 402 is coupled to a second DSG line represented by DSG1. The second finger 404 can include a third memory string coupled to a third DSG line represented by DSG 2, and a fourth memory string coupled to a fourth DSG line represented by DSG 3.

In some implementations, memory cells 106 in adjacent memory strings 408, 418 can be coupled through word lines. Example word lines shown in FIG. 4 include Dummy WL, WL1, WL2, WL3, WL4, and WL5 that are between DSG line and SSG line. For example, memory cells 106 of the same vertical position (e.g., along z direction) in adjacent memory strings 408, 418 are coupled to the same word line.

In some implementations, the DSG transistors 112 of different cell strings (e.g., cell string 108 of FIG. 1) in the same memory string 408, 418 are coupled to different bit lines 116, 126. For example, DSG transistor 112 of a first string of the first memory string 408 is coupled to a first bit line 116, and DSG transistor 112 of a second string of the first memory string 408 is coupled to a second bit line 126. A bit line 116, 126 can connect strings of different memory strings. For example, the first string of the first memory string 408 and a third string of the second memory string 418 are both coupled to the first bit line 116 through their respective DSG transistors 112.

Figure 5:
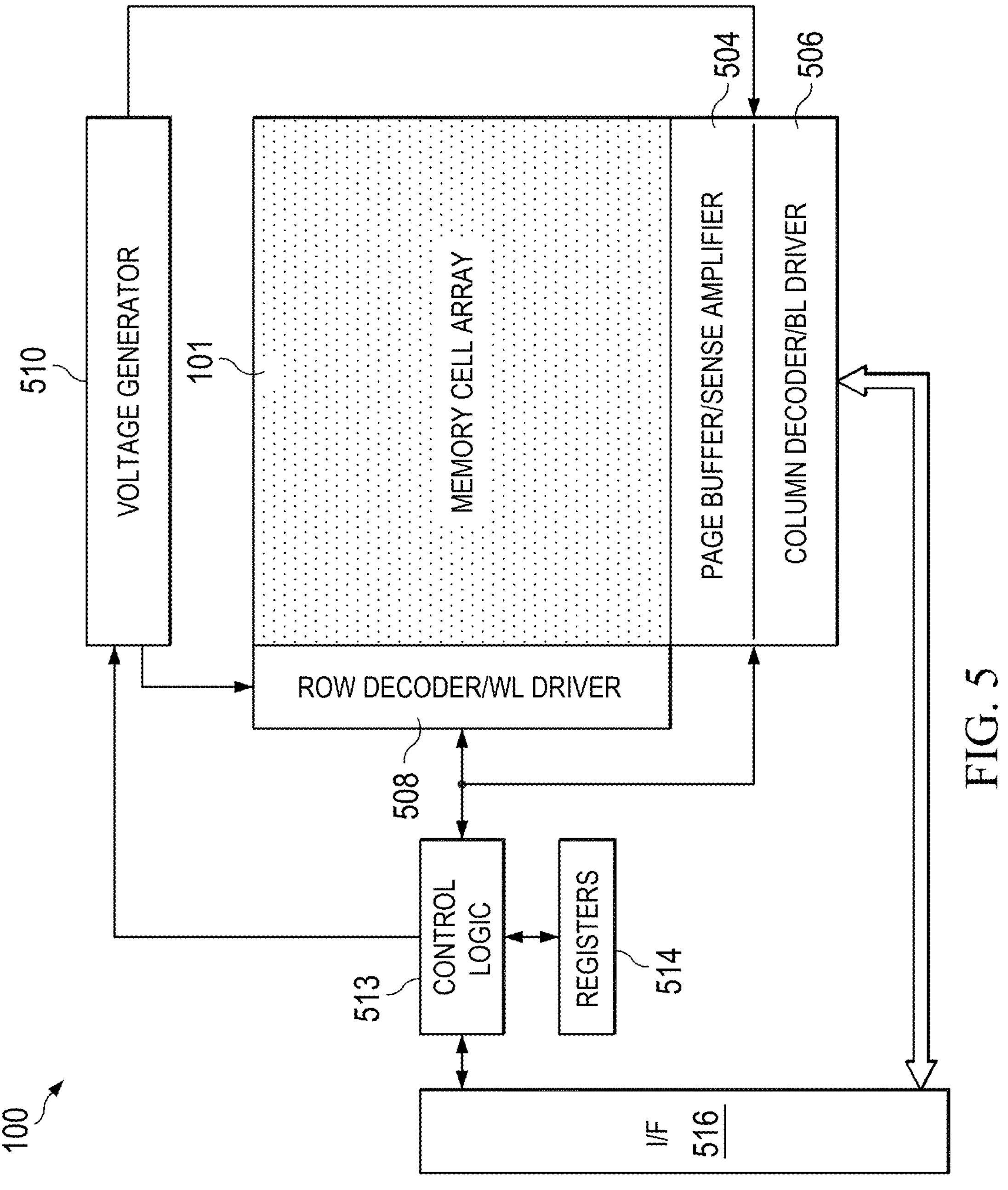
FIG. 5 illustrates some example peripheral circuits, according to some aspects of the present disclosure.

FIG. 5 illustrates some example peripheral circuits, according to some aspects of the present disclosure. The example peripheral circuits include a page buffer/sense amplifier 504, a column decoder/bit line driver 506, a row decoder/word line driver 508, a voltage generator 510, control logic 512, registers 514, an interface 516, and a data bus. In some examples, additional peripheral circuits not shown in FIG. 5 may be included as well.

The page buffer/sense amplifier 504 can be configured to read and program (write) data from and to memory array 101 according to the control signals from control logic 512. In an example, the page buffer/sense amplifier 504 may store one page of program data (write data) to be programmed into one page of the memory array 101. In another example, the page buffer/sense amplifier 504 may perform program verification operations to ensure that the data has been properly programmed into memory cells 106 coupled to selected word lines 118. In still another example, the page buffer/sense amplifier 504 may also sense the low power signals from the bit line 116 that represents a data bit stored in memory cell 106, and amplify the small voltage swing to recognizable logic levels in a read operation. The column decoder/bit line driver 506 can be configured to be controlled by the control logic 512 and select one or more memory strings 408, 418 by applying bit line voltages generated from the voltage generator 510.

The row decoder/word line driver 508 can be configured to be controlled by the control logic 512 and select/unselect blocks 304 of the memory array 101 and select/unselect word lines 118 of the block 304. The row decoder/word line driver 508 can be further configured to drive word lines 118 using word line voltages generated from the voltage generator 510. In some implementations, the row decoder/word line driver 508 can also select/unselect and drive SSG lines 115 and DSG lines 113. As described below in detail, the row decoder/word line driver 508 is configured to apply a program voltage to selected word line 118 in a program operation on memory cell 106 coupled to selected word line 118.

The voltage generator 510 can be configured to be controlled by the control logic 512 and generate the word line voltages (e.g., read voltage, program voltage, pass voltage, local voltage, verify voltage, etc.), bit line voltages, and source line voltages to be supplied to the memory array 101.

The control logic 512 can be coupled to each peripheral circuit described above and configured to control operations of each peripheral circuit. The registers 514 can be coupled to the control logic 512 and include status registers, command registers, and address registers for storing status information, command operation codes (OP codes), and command addresses for controlling the operations of each peripheral circuit.

The interface 516 can be coupled to the control logic 512 and act as a control buffer to buffer and relay control commands received from a host (not shown) to the control logic 512 and status information received from the control logic 512 to the host. The interface 516 can also be coupled to the column decoder/bit line driver 506 via a data bus, and act as a data input/output (I/O) interface and a data buffer to buffer and relay data to and from the memory array 101.

Figures 6A, 6B:
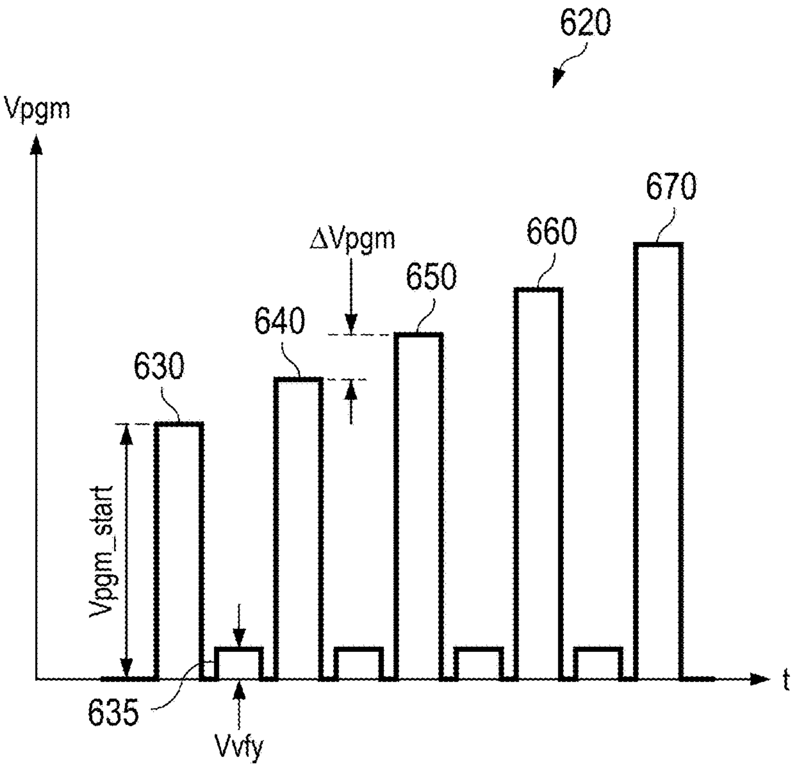
FIG. 6A illustrates an example incremental step pulse programming (ISPP) scheme, according to some aspects of the present disclosure.
FIG. 6B illustrates an example verification scheme of an example ISPP scheme, according to some aspects of the present disclosure.

FIG. 6A illustrates an example incremental step pulse programming (ISPP) scheme, according to some aspects of the present disclosure. The ISPP scheme 620 can include a plurality of program pulses 630, 640, 650, 660, 670. Each program pulse can have a program voltage $V_{pgm}$ (e.g., a voltage between 10 V and 30 V), and can have a pulse length (e.g., a time duration between 1 μs to 30 μs) during which the program voltage is applied. In some implementations, a starting or initial program pulse 630 can have a program voltage $V_{pgm\_start}$, and the program voltages of the following program pulses 640, 650, 660, 670 are each incremented by voltage $\Delta V_{pgm}$. The pulse length of the program pulses 630, 640, 650, 660, 670 can be the same. In some implementations, the memory device can apply several program pulses 630, 640, 650, 660, 670 to program memory cells 106 to a target programmed state.

As shown in FIG. 6A, the ISPP scheme 620 includes a plurality of programing-verification loops (also referred to as loops) performed in order. Each loop includes a program pulse (e.g., program pulse 630) and a verification pulse 635 that follows the program pulse. That is, in each loop, the memory device can perform a verification operation using the verification pulse 635, in order to determine whether the program pulse (e.g., program pulse 630) has programmed memory cells to the target programmed state. If the verification operation indicates that some or all of the memory cells has not yet been programmed to the target programmed state, these memory cells can be programmed again using the program pulse (e.g., program pulse 640) of a subsequent loop, and verified again using the verification pulse of the subsequent loop.

FIG. 6B illustrates an example verification scheme of an example ISPP scheme 620, according to some aspects of the present disclosure. In some implementations, some loops of the ISPP scheme 620 can include more than one verification pulse. In other words, in one loop, the memory device can verify whether memory cells have been programmed to each programmed state of more than one programmed state. In some implementations, in one loop, a verification operation that verifies whether memory cells have been programmed to a lower programmed state is performed before a verification operation that verifies whether memory cells have been programmed to a higher programmed state. For example, as shown in FIG. 6B, an ISPP scheme 620 used to program TLCs can include 23 loops. For the first six loops, each loop includes only one verification pulse 635 after the program pulse 630. The 7$^{th}$ loop includes two verification pulses: the first verification pulse can verify whether memory cells have been programmed to programmed state P1, and the second verification pulse can verify whether memory cells have been programmed to programmed state P2. As another example, the 13$^{th}$ loop includes three verification pulses: the first verification pulse can verify whether memory cells have been programmed to programmed state P3, the second verification pulse can verify whether memory cells have been programmed to programmed state P4, and the third verification pulse can verify whether memory cells have been programmed to programmed state P5.

It should be noted that the verification scheme of FIG. 6B is for illustration purposes only. The verification scheme of ISPP schemes 620 for TLCs can vary, e.g., according to performance needs of specific memory devices. Further, different ISPP schemes with respective verification schemes may be applied to program MLCs or QLCs.

Figure 7:
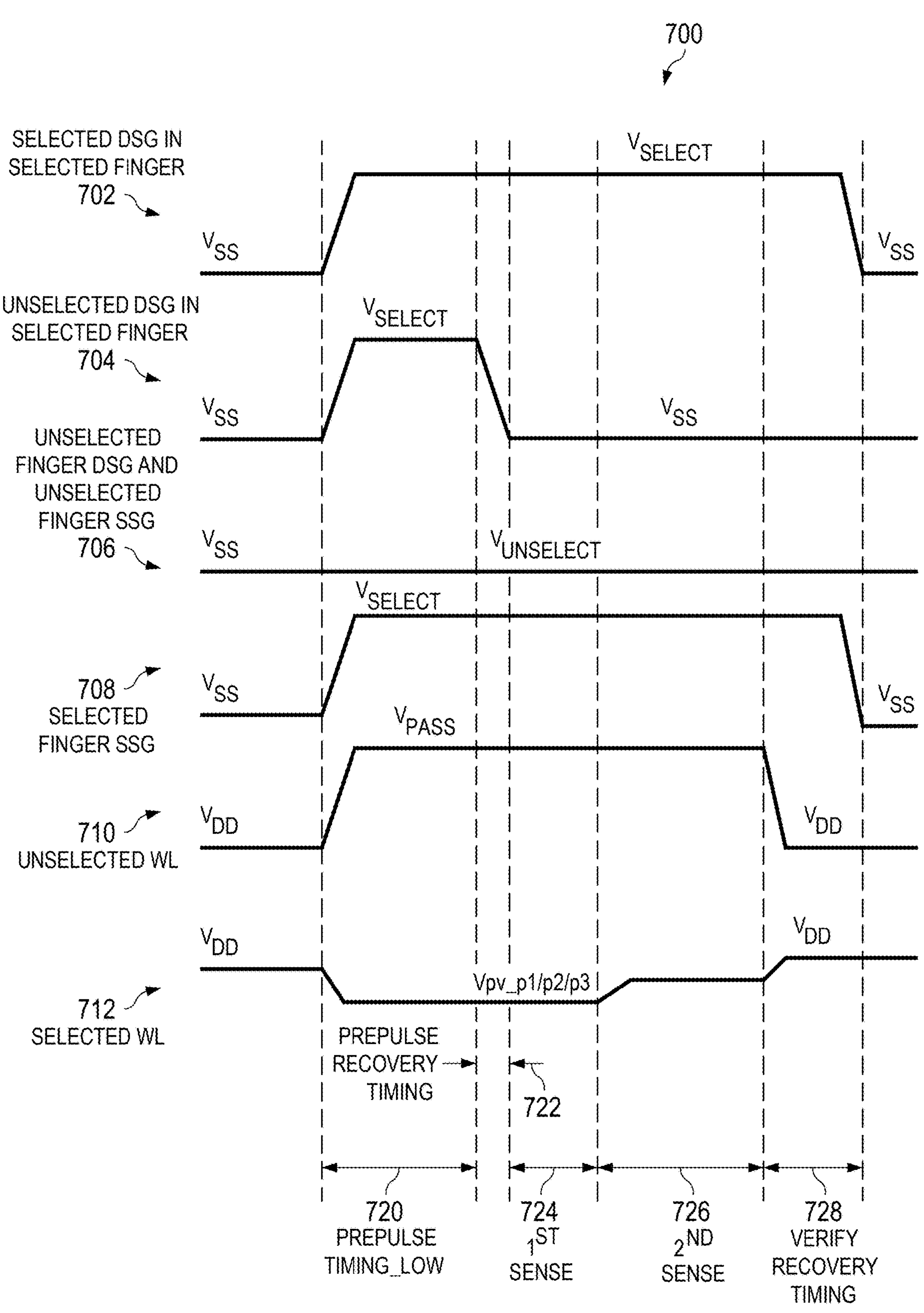
FIG. 7 illustrates an example of voltages of components in a block during a verification operation of the block, according to some aspects of the present disclosure.
Figure 8:
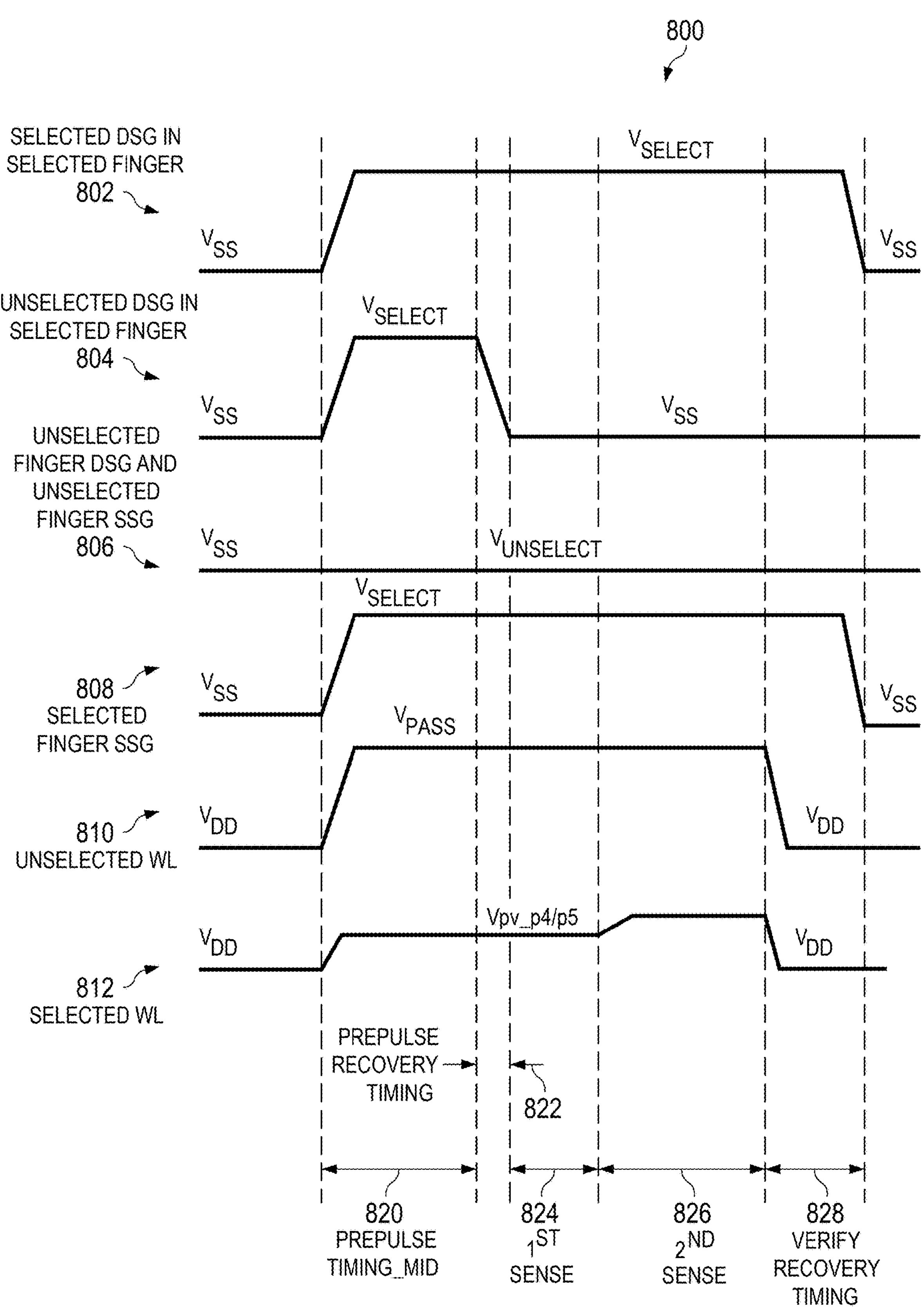
FIG. 8 illustrates another example of voltages of components in a block during a verification operation of the block, according to some aspects of the present disclosure.
Figure 9:
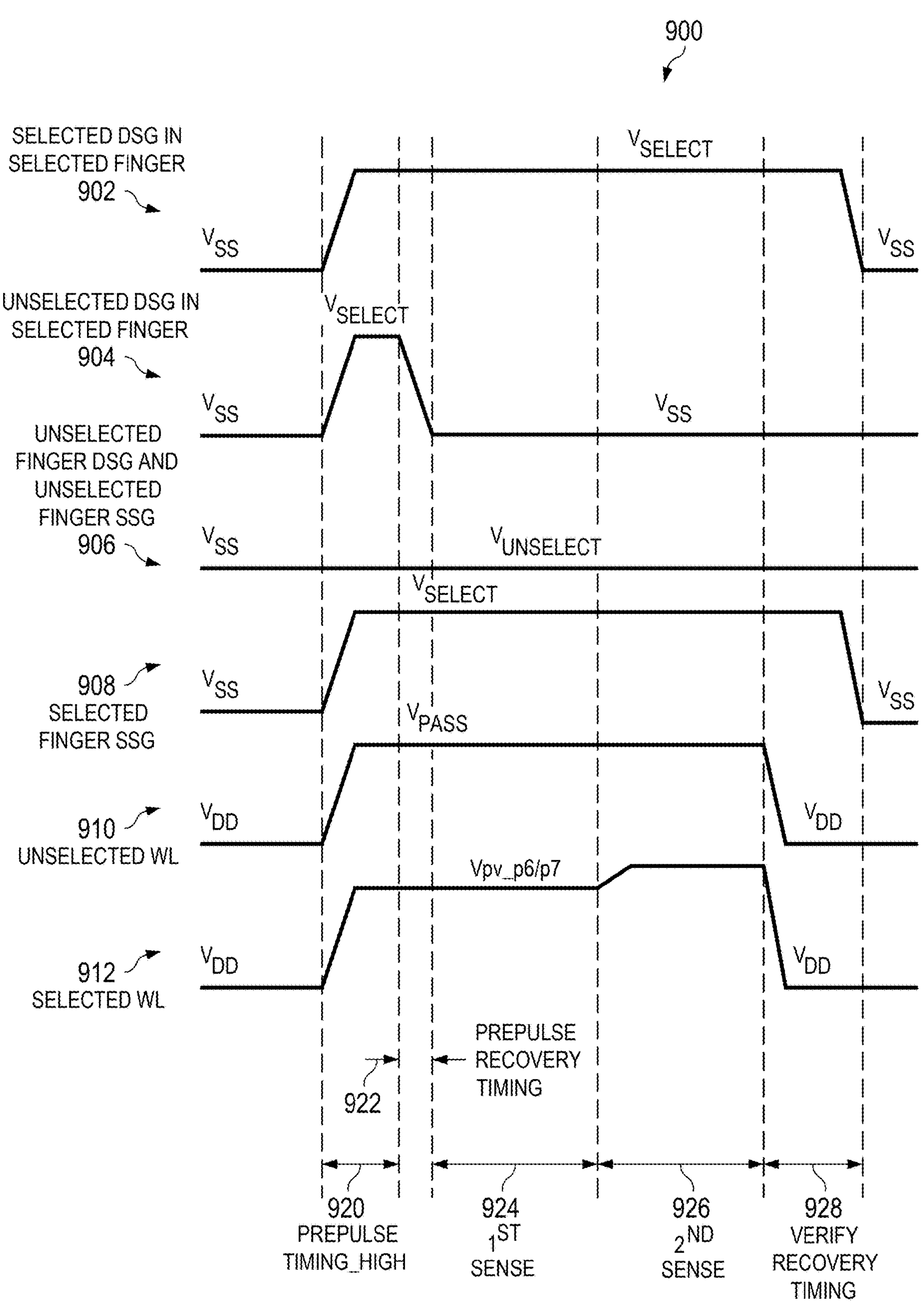
FIG. 9 illustrates another example of voltages of components in a block during a verification operation of the block, according to some aspects of the present disclosure.

In some implementations, programmed states of xLCs can be categorized into two or more groups, and each group corresponds to a same pre-pulse duration. For example, programmed states P1-P7 of TLCs can be categorized into low, middle, and high groups. The low group can include, for example, P1, P2, and P3. The middle group can include, for example, P4 and P5. The high group can include, for example, P6 and P7. FIGS. 7-9 illustrates example voltages of different components in a block of memory cells during verification operations for verifying programmed states in three groups. In some implementations, programmed states of xLCs can be categorized in a different manner (e.g., different number of groups and different programmed states in a group), and the pre-pulse durations for programmed states can be different from the examples shown in FIGS. 7-9.

FIG. 7 illustrates an example of voltages of components in a block (e.g., block 304 of FIGS. 3-4) during a verification operation 700 of the block, according to some aspects of the present disclosure. A memory string (e.g., the first memory string 408 of FIG. 4) selected for programming in the block is a selected memory string. A memory string (e.g., the second memory string 418 of FIG. 4) deselected for programming in the block is an unselected memory string. A finger (e.g., the first finger 402 in FIG. 4) that includes the selected memory string is a selected finger. A finger (e.g., the second finger 404 in FIG. 4) that does not include selected memory strings is an unselected finger.

In some implementations, selected DSG in selected finger 702 represents a drain select line (e.g., DSG0 in FIG. 4) coupled to DSG transistor of a selected memory string. Unselected DSG in selected finger 704 represents a drain select line (e.g., DSG1 in FIG. 4) coupled to DSG transistor of an unselected memory string in a selected finger. Unselected finger DSG and unselected finger SSG 706 represents a drain select line (e.g., DSG2 and DSG3 in FIG. 4) coupled to DSG transistors of memory strings in an unselected finger, and also represents a source select line (e.g., SSG1 in FIG. 4) coupled to SSG transistors of memory strings in an unselected finger. Selected finger SSG 708 represents a source select line (e.g., SSG0 in FIG. 4) coupled to SSG transistors of memory strings in a selected finger. Unselected WL 710 represents a word line in the block unselected for programming and verification. Selected WL 712 represents a word line in the block selected for programming and verification.

In some implementations, the verification operation 700 can include a pre-pulse phase 720 at the beginning, a pre-pulse recovery phase 722, one or more sense phases 724, 726, and a recovery phase 728 at the end. The voltages shown in FIG. 7 can represent voltages during a verification operation 700 configured to verify whether memory cells in the selected memory string have been programmed to a target programmed state, such as a low programmed state (e.g., P1, P2 or P3 of TLCs). Since memory cells in low programmed states are more sensitive to HCl effect than higher programmed states, a duration of the pre-pulse phase 720 can be longer than the one for middle or high programmed states to mitigate HCl effect.

During the pre-pulse phase 720, a pass voltage is applied to unselected WL 710, and a verification voltage of the first sense phase 724 is applied to selected WL 712. In addition, a select voltage is applied to selected DSG in selected finger 702, unselected DSG in selected finger 704, and selected finger SSG 708. As such, the respective DSG transistor and SSG transistor of both selected and unselected memory strings in the selected finger are switched on. That is, other than selected memory strings, unselected memory strings in the selected finger are also in on-state. Therefore, it is possible to set the channel potential of the unselected memory strings in the selected finger to the ground voltage $V_{ss}$, by coupling the channel of such memory strings to a common source line (e.g., common source line 114 in FIG. 1). As such, there may not be a large voltage difference in the channel of the unselected memory string (e.g., between the DSG transistor and a memory cell coupled to the selected word line) during sense phases 724, 726, which can mitigate HCl effect.

During the pre-pulse recovery phase 722, the voltage of unselected DSG in selected finger 704 decreases from the select voltage to an unselect voltage (e.g., $V_{ss}$). As such, the unselected memory string in the selected finger is switched off during sense phases 724, 726, so that only memory cells in selected memory string are verified during sense phases 724, 726.

The verification operation 700 can include one or more sense phases 724 and 726. During a first sense phase 724, a first verification voltage is applied to selected WL 712 to verify whether memory cells in the selected memory string have been programmed to a first programmed state (e.g., P1 or P2). During a second sense phase 726, a second verification voltage is applied to selected WL 712 to verify whether memory cells in the selected memory string have been programmed to a second programmed state (e.g., P2 or P3). In some implementations, the second verification voltage is higher than the first verification voltage. In some implementations, the verification operation 700 may not include the second sense phase 726, or may include a third sense phase after the second sense phase. For example, referring back to FIG. 6B, the verification operation of the 11$^{th}$ loop of the ISPP scheme 620 can include a first sense operation to verify whether memory cells are in P2, and a second sense operation to verify whether memory cells are in P3.

During the recovery phase 728, voltage of selected DSG in selected finger 702 decreases to ground voltage $V_{ss}$. Voltage of selected finger SSG 708 decreases to ground voltage $V_{ss}$. Voltage of unselected WL 710 decreases to power supply voltage $V_{dd}$, and selected WL 712 decreases (or increases, in some cases) to power supply voltage $V_{dd}$. In some implementations, the verification voltage (e.g., the second verification voltage) applied to selected WL 712 during the last sense phase (e.g., the second sense phase 726)

before the recovery phase 728 is lower than the ground voltage $V_{ss}$, for example, when verifying a low programmed state during the last sense phase. In such case, voltage of selected WL 712 increases to power supply voltage $V_{dd}$ during the recovery phase 728. By adjusting the voltage of select WL 712 to power supply voltage $V_{dd}$, the block can be prepared for a program pulse of a subsequent loop.

In some implementations, throughout the verification operation, an unselect voltage is applied to unselected finger DSG and unselected finger SSG 706. As such, the respective DSG transistor and SSG transistor of memory strings in unselected fingers are switched off. Therefore, memory strings in unselected fingers are in a floating state during the pre-pulse phase 720, which can mitigate the coupling effect by the unselected memory strings on the selected word line, thereby reducing time to establish voltages on the selected word line.

In some implementations, memory strings in unselected fingers of the block can also be pre-pulsed during the pre-pulse phase. Specifically, a select voltage can be applied to unselected finger DSG during the pre-pulse phase (similar to unselected DSG in selected finger 704), and a select voltage can be applied to unselected finger SSG during the pre-pulse phase and the sense phase 724, 726 (similar to selected finger SSG 708).

FIG. 8 illustrates an example of voltages of components in a block (e.g., block 304 of FIGS. 3-4) during a verification operation 800 of the block, according to some aspects of the present disclosure. In some implementations, the verification operation 800 can include a pre-pulse phase 820 at the beginning, a pre-pulse recovery phase 822, one or more sense phases 824, 826, and a recovery phase 828 at the end. The voltages shown in FIG. 8 can represent voltages during a verification operation 800 configured to verify whether memory cells in the selected memory string have been programmed to a target programmed state, such as a middle programmed state (e.g., P4, P5 of TLCs). Since memory cells in middle programmed states are less sensitive to HCl effect than low programmed states, a duration of the pre-pulse phase 820 can be shorter than the duration of the pre-pulse phase 720 of the verification operation 700.

Voltage conditions of most components of the block, for example, selected DSG in selected finger 802, unselected finger DSG and unselected finger SSG 806, selected finger SSG 808, unselected WL 810 are identical to selected DSG in selected finger 702, unselected finger DSG and unselected finger SSG 706, selected finger SSG 708, unselected WL 710 in FIG. 7, except for unselected DSG in selected finger 804 and selected WL 812.

Since the pre-pulse phase 820 is shorter than the pre-pulse phase 720, in the verification operation 800, a select voltage is applied for a shorter time on unselected DSG in selected finger 804 than in verification operation 700.

During the pre-pulse phase 820 and a first sense phase 824, a first verification voltage is applied to selected WL 812 to verify whether memory cells in the selected memory string have been programmed to a first programmed state (e.g., P4). During a second sense phase 826, a second verification voltage is applied to selected WL 812 to verify whether memory cells in the selected memory string have been programmed to a second programmed state (e.g., P5). In some implementations, the verification operation 800 may not include the second sense phase 826, or may include a third sense phase after the second sense phase. For example, referring back to FIG. 6B, the verification operation of the 14$^{th}$ or the 15$^{th}$ loop of the ISPP scheme 620 can include a first sense operation verifying whether memory cells are in P4, and a second sense operation verifying whether memory cells are in P5.

FIG. 9 illustrates an example of voltages of components in a block (e.g., block 304 of FIGS. 3-4) during a verification operation 900 of the block, according to some aspects of the present disclosure. In some implementations, the verification operation 900 can include a pre-pulse phase 920 at the beginning, a pre-pulse recovery phase 922, one or more sense phases 924, 926, and a recovery phase 928 at the end. The voltages shown in FIG. 9 can represent voltages during a verification operation 900 configured to verify whether memory cells in the selected memory string have been programmed to a target programmed state, such as a high programmed state (e.g., P6, P7 of TLCs). Since memory cells in high programmed states are even less sensitive to HCl effect than middle programmed states, a duration of the pre-pulse phase 920 can be shorter than the duration of the pre-pulse phase 820 of the verification operation 800. In some implementations, the verification operation 900 may not include the pre-pulse phase 920, and can start with the sense phase 924.

Voltage conditions of most components of the block, for example, selected DSG in selected finger 902, unselected finger DSG and unselected finger SSG 906, selected finger SSG 908, unselected WL 910 are identical to selected DSG in selected finger 702, unselected finger DSG and unselected finger SSG 706, selected finger SSG 708, unselected WL 710 in FIG. 7, except for unselected DSG in selected finger 904 and selected WL 912.

Since the pre-pulse phase 920 is shorter than the pre-pulse phase 720 and the pre-pulse phase 820, in the verification operation 900, a select voltage is applied for a shorter time on unselected DSG in selected finger 904 than in verification operations 700, 800. In some implementations, the verification operation 900 does not include the pre-pulse phase 920. That is, an unselect voltage is applied to unselected DSG in selected finger 904 throughout the verification operation 900.

During the pre-pulse phase 920 and a first sense phase 924, a first verification voltage is applied to selected WL 912 to verify whether memory cells in the selected memory string have been programmed to a first programmed state (e.g., P6). During a second sense phase 926, a second verification voltage is applied to selected WL 912 to verify whether memory cells in the selected memory string have been programmed to a second programmed state (e.g., P7). In some implementations, the verification operation 900 may not include the second sense phase 926, or may include a third sense phase after the second sense phase. For example, referring back to FIG. 6B, the verification operation of the 19$^{th}$ or the 20$^{th}$ loop of the ISPP scheme 620 can include a first sense operation verifying whether memory cells are in P6, and a second sense operation verifying whether memory cells are in P7.

In some implementations, the memory device is configured to determine the duration of the pre-pulse phase of a verification operation based on one or more threshold states. The one or more threshold states can one or more predetermined programmed states that are used to divide programmed states into different groups. For example, programmed states lower than a first threshold state (e.g., P4) are in a first group (e.g., low programmed states), programmed states higher than or equal to the first threshold state and lower than a second threshold state (e.g., P6) are in a second group (e.g., middle programmed states), and programmed states higher than the second threshold state are in a third group (e.g., high programmed states). In some implementations, the threshold states can be pre-determined based on Esum requirements. For example, in the design process of a memory device, experiments can be performed to test Esum performances relative to pre-pulse durations that are varied based on programmed state groupings according to candidate threshold states. The pre-determined threshold states selected from the candidate threshold states can group the programmed states in a way such that the memory device can maintain the same or slightly degraded (within a threshold) Esum performance, compared to scenarios where pre-pulse durations are the same for different programmed states.

In some implementations, the pre-determined threshold states can be stored in a storage medium (e.g., a SRAM coupled to control logic 513 of FIG. 5) of the memory device. For example, in response determining the programmed state to be verified in a first sense phase (e.g., first sense phase 724 of FIG. 7) is lower than a first threshold state (e.g., P4), the memory device can perform the verification operation (e.g., verification operation 700 of FIG. 7) with a long pre-pulse phase (e.g., pre-pulse phase 720 in FIG. 7). In response determining the programmed state to be verified in a first sense phase (e.g., first sense phase 824 of FIG. 8) is higher than or equal to the first threshold state and lower than a second threshold state (e.g., P6), the memory device can perform the verification operation (e.g., verification operation 800 of FIG. 8) with a medium pre-pulse phase (e.g., pre-pulse phase 820 in FIG. 8). In response determining the programmed state to be verified in a first sense phase (e.g., first sense phase 924 of FIG. 9) is higher than or equal to the second threshold state, the memory device can perform the verification operation (e.g., verification operation 900 of FIG. 9) with a short pre-pulse phase (e.g., pre-pulse phase 920 in FIG. 9), or without a pre-pulse phase.

Figure 10:
FIG. 10 illustrates an example of a flow chart of a method for performing a program operation in a memory device, according to some aspects of the present disclosure.
Figure 10:
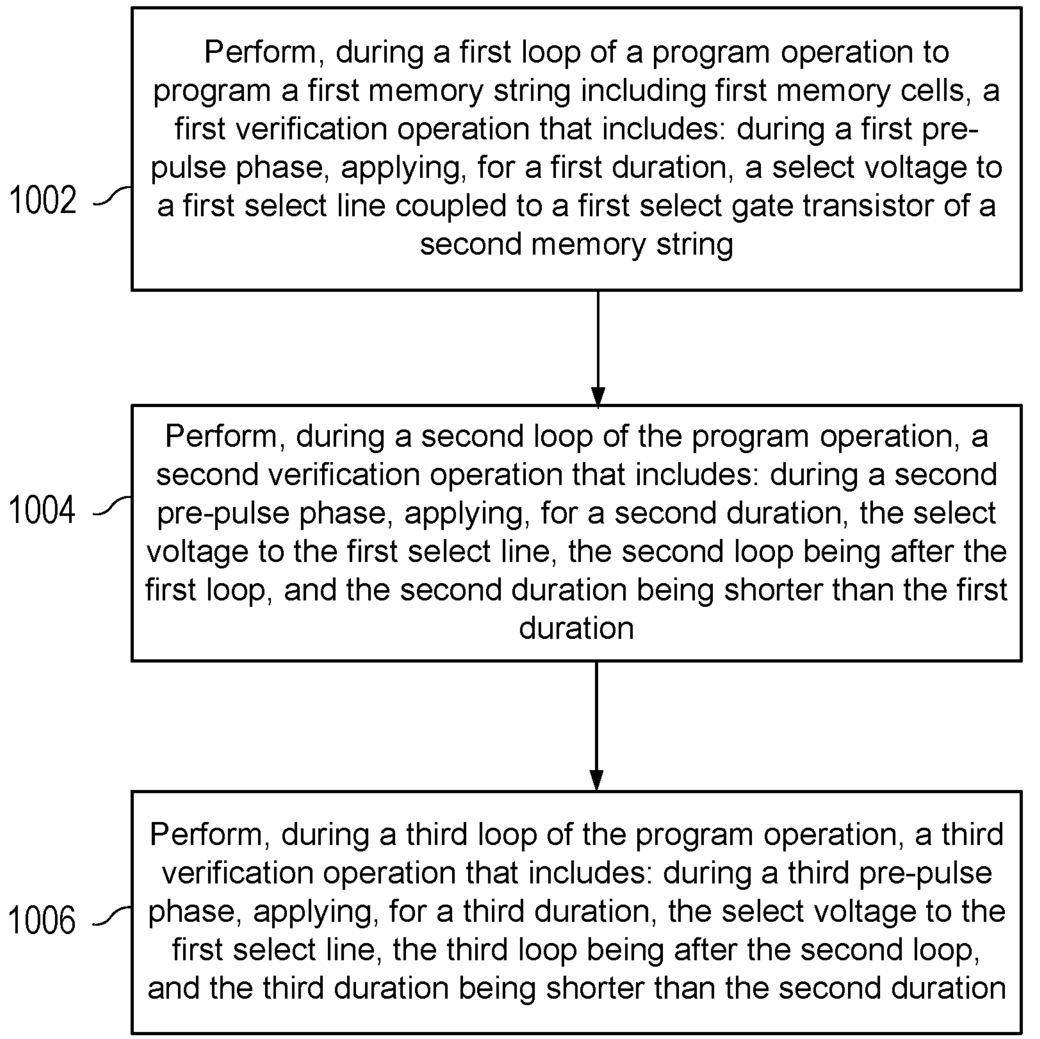

FIG. 10 illustrates a flow chart of an example process 1000 for performing a program operation in a memory device, according to some aspects of the present disclosure. Process 1000 can be performed by any suitable device or system as described herein, for example, according to the example techniques described with respect to FIGS. 1-9. For example, process 1000 can be performed by a memory device, such as the memory device 100 of FIGS. 1-5 that includes a memory array 101. The memory array 101 can include one or more blocks 304 that each include one or more fingers (e.g., finger 334 of FIG. 3, fingers 402, 404 of FIG. 4). Each finger can include one or more memory strings (e.g., memory string 310 of FIG. 3, memory string 408, 418 of FIG. 4). A selected memory string (e.g., the first memory string 408 of FIG. 4) includes memory cells that are programmed and verified during the program operation. Memory cells in an unselected memory string (e.g., the second memory string 418 of FIG. 4) are not programmed or verified during the program operation. In some implementations, the memory device can also include peripheral circuits (e.g., peripheral circuits 102 of FIG. 1). The memory device can be a part of a memory system, such as memory system 1102 of FIG. 11. The program operation can be performed based on an ISPP scheme (e.g., ISPP scheme 620 of FIG. 6A) that includes a plurality of loops. Each loop includes a program pulse (e.g., program pulse 630 of FIG. 6A) and one or more verification pulses (e.g., verification pulse 635 of FIG. 6A).

The operations shown in process 1000 may not be exhaustive and that other operations can be performed as well before, after, or in between any of the illustrated operations. Further, some of the operations may be performed simultaneously, or in a different order than shown in FIG. 10. In some implementations, some of the operations may be performed by or one or more components of a device or a system, such as, a peripheral circuit of the memory device.

At 1002, during a first loop of a program operation to program a first memory string (e.g., selected memory string 408 of FIG. 4) including first memory cells (e.g., memory cell 106 of FIG. 1), a first verification operation (e.g., verification operation 700 of FIG. 7) is performed. Performing the first verification operation includes: during a first pre-pulse phase (e.g., pre-pulse phase 720 of FIG. 7) of the first verification operation, applying, for a first duration, a select voltage to a first select line (e.g., drain select line DSG1 of FIG. 4) coupled to a first select gate transistor (e.g., DSG transistor) of a second memory string (e.g. unselected memory string 418 of FIG. 4). The first verification operation can verify whether memory cells in the first memory string have been programmed to a low programmed state (e.g., P1, P2, or P3 of TLCs). In some implementations, the second memory string is included in the same finger as the first memory string.

At 1004, during a second loop of the program operation, a second verification operation (e.g., verification operation 800 of FIG. 8) is performed. The second loop is after the first loop in the ISPP scheme (e.g., ISPP scheme 620 of FIG. 6A). Performing the second verification operation includes: during a second pre-pulse phase (e.g., pre-pulse phase 820 of FIG. 8) of the second verification operation, applying the select voltage to the first select line for a second duration. The second verification operation can verify whether memory cells in the first memory string have been programmed to a middle programmed state (e.g., P4 or P5 of TLCs). The second duration is shorter than the first duration.

At 1006, during a third loop of the program operation, a third verification operation (e.g., verification operation 900 of FIG. 9) is performed. The third loop is after the second loop in the ISPP scheme. Performing the third verification operation includes: during a third pre-pulse phase (e.g., pre-pulse phase 920 of FIG. 9) of the third verification operation, applying the select voltage to the first select line for a third duration. The third verification operation can verify whether memory cells in the first memory string have been programmed to a high programmed state (e.g., P6 or P7 of TLCs). The third duration is shorter than the second duration. In some implementations, the third verification operation does not include a pre-pulse phase before one or more sense phases (e.g., sense phases 924, 926 of FIG. 9).

Figure 11:
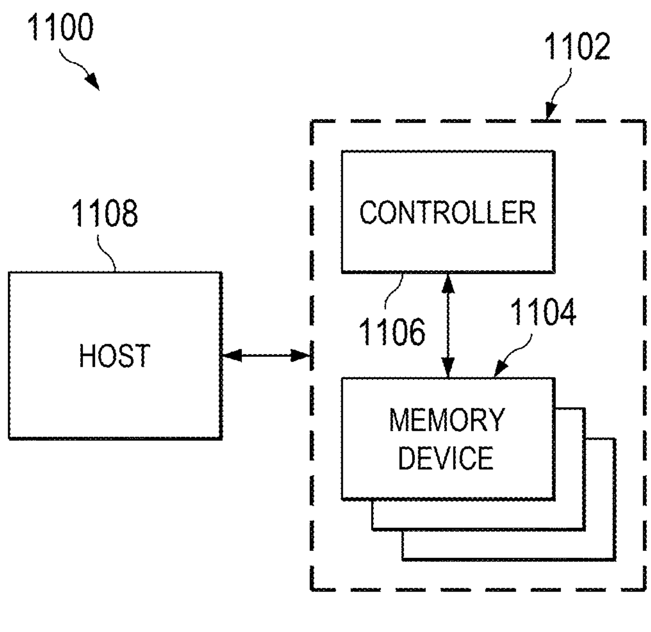
FIG. 11 illustrates a block diagram of an example system having a memory device, according to some aspects of the present disclosure.

FIG. 11 illustrates a block diagram of an example system 1100 having a memory device, according to some aspects of the present disclosure. System 1100 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. System 1100 can include a host 1108 and a memory system 1102 having one or more memory devices 1104 and a memory controller 1106. Host 1108 can be a processor of an electronic device, such as a central processing unit (CPU), or a system-on-chip (SoC), such as an application processor (AP). Host 1108 can be configured to send or receive data to or from memory devices 1104.

Memory device 1104 can be any memory device disclosed in the present disclosure. Memory controller 1106 is coupled to memory device 1104 and host 1108 and is configured to control the memory device 1104, according to some implementations. Memory controller 1106 can manage the data stored in memory device 1104 and communicate with host 1108. In some implementations, memory controller 1106 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 1106 is designed for operating in a high duty-cycle environment SSDs or embedded multi-media-cards (eMMCs) used as data storage for mobile devices, such as smartphones, tablets, laptop computers, etc., and enterprise storage arrays. Memory controller 1106 can be configured to control operations of memory device 1104, such as read, erase, and program operations. Memory controller 1106 can also be configured to manage various functions with respect to the data stored or to be stored in memory device 1104 including, but not limited to bad-block management, garbage collection, logical-to-physical address conversion, wear leveling, etc. In some implementations, memory controller 1106 is further configured to process error correction codes (ECCs) with respect to the data read from or written to memory device 1104. Any other suitable functions may be performed by memory controller 1106 as well, for example, formatting memory device 1104.

Memory controller 1106 can communicate with an external device (e.g., host 1108) according to a particular communication protocol. For example, memory controller 1106 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 12A:
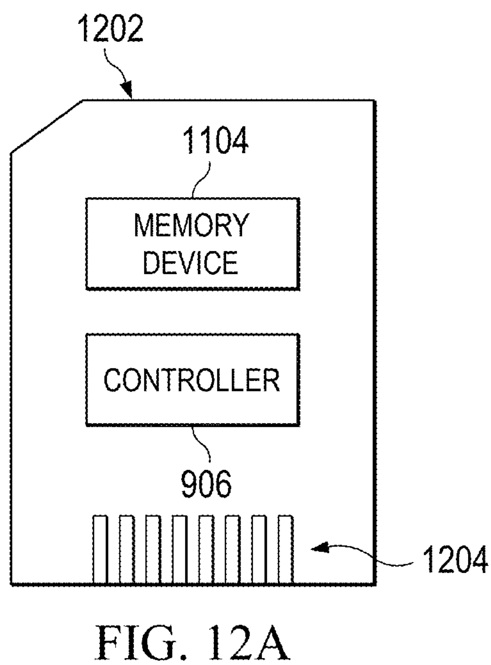
FIG. 12A illustrates a diagram of a memory card having a memory device, according to some aspects of the present disclosure.
Figure 12B:
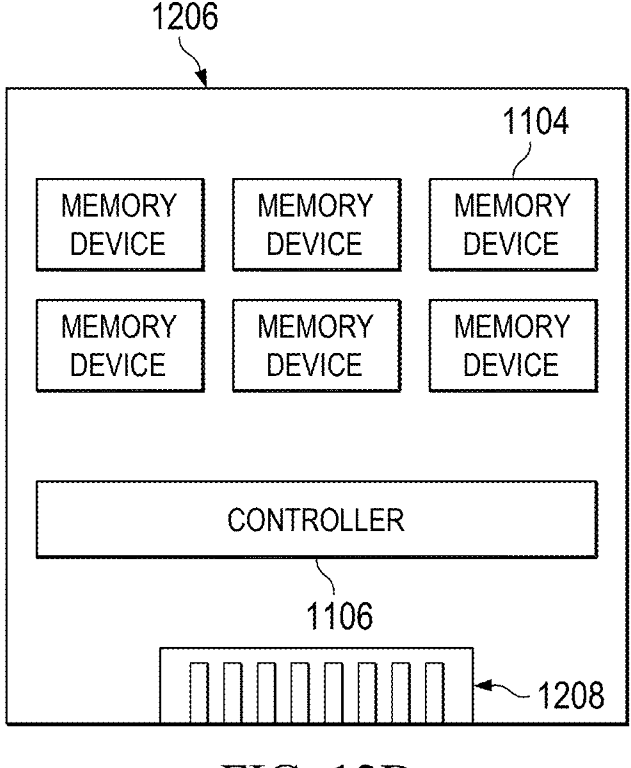
FIG. 12B illustrates a diagram of a solid-state drive (SSD) having a memory device, according to some aspects of the present disclosure.

Memory controller 1106 and one or more memory devices 1104 can be integrated into various types of storage devices. For example, memory controller 1106 and one or more memory devices 1104 can be packaged in a universal Flash storage (UFS) package or an eMMC package. In one example as shown in FIG. 12A, memory controller 1106 and a single memory device 1104 may be integrated into a memory card 1202. Memory card 1202 can include a PC card (PCMCIA, personal computer memory card international association), a CF card, a smart media (SM) card, a memory stick, a multimedia card (MMC, RS-MMC, MMC-micro), an SD card (SD, miniSD, microSD, SDHC), a UFS, etc. Memory card 1202 can further include a memory card connector 1204 coupling memory card 1202 with a host (e.g., host 1108 in FIG. 11). In another example as shown in FIG. 12B, memory controller 1106 and multiple memory devices 1104 may be integrated into an SSD 1206. SSD 1206 can further include an SSD connector 1208 coupling SSD 1206 with a host (e.g., host 1108 in FIG. 11). In some implementations, the storage capacity and/or the operation speed of SSD 1206 is greater than those of memory card 1202.

While this specification contains many specific implementation details, these should not be construed as limitations on the scope of what may be claimed, but rather as descriptions of features that may be specific to particular implementations. Certain features that are described in this specification in the context of separate implementations can also be implemented, in combination, in a single implementation. Conversely, various features that are described in the context of a single implementation can also be implemented in multiple implementations, separately, or in any sub-combination. Moreover, although previously described features may be described as acting in certain combinations and even initially claimed as such, one or more features from a claimed combination can, in some cases, be excised from the combination, and the claimed combination may be directed to a sub-combination or variation of a sub-combination.

As used in this disclosure, the terms "a," "an," or "the" are used to include one or more than one unless the context clearly dictates otherwise. The term "or" is used to refer to a nonexclusive "or" unless otherwise indicated. The statement "at least one of A and B" has the same meaning as "A, B, or A and B." In addition, the phraseology or terminology employed in this disclosure, and not otherwise defined, is for the purpose of description only and not of limitation. Any use of section headings is intended to aid reading of the document and is not to be interpreted as limiting; information that is relevant to a section heading may occur within or outside of that particular section.

As used in this disclosure, the term "about" or "approximately" can allow for a degree of variability in a value or range, for example, within 10%, within 5%, or within 10% of a stated value or of a stated limit of a range.

As used in this disclosure, the term "substantially" refers to a majority of, or mostly, as in at least about 50%, 60%, 70%, 80%, 90%, 95%, 96%, 97%, 98%, 99%, 99.5%, 99.9%, 99.99%, or at least about 99.999% or more.

Values expressed in a range format should be interpreted in a flexible manner to include not only the numerical values explicitly recited as the limits of the range, but also to include all the individual numerical values or sub-ranges encompassed within that range as if each numerical value and sub-range is explicitly recited. For example, a range of "0.10% to about 5%" or "0.1% to 5%" should be interpreted to include about 0.1% to about 5%, as well as the individual values (for example, 1%, 2%, 3%, and 4%) and the sub-ranges (for example, 0.1% to 0.5%, 1.1% to 2.2%, 3.3% to 4.4%) within the indicated range. The statement "X to Y" has the same meaning as "about X to about Y," unless indicated otherwise. Likewise, the statement "X, Y, or Z" has the same meaning as "about X, about Y, or about Z," unless indicated otherwise.

Particular implementations of the subject matter have been described. Other implementations, alterations, and permutations of the described implementations are within the scope of the following claims as will be apparent to those skilled in the art. While operations are depicted in the drawings or claims in a particular order, such operations are not required be performed in the particular order shown or in sequential order, or that all illustrated operations be performed (some operations may be considered optional), to achieve desirable results. In certain circumstances, multitasking or parallel processing (or a combination of multitasking and parallel processing) may be advantageous and performed as deemed appropriate.

Moreover, the separation or integration of various system modules and components in the previously described implementations are not required in all implementations, and the described components and systems can generally be integrated together or packaged into multiple products.

Accordingly, the previously described example implementations do not define or constrain the present disclosure. Other changes, substitutions, and alterations are also possible without departing from the spirit and scope of the present disclosure.

What is claimed is:

1. A memory device, comprising:

a memory array comprising:

a first memory string comprising first memory cells; and a second memory string comprising a first select gate transistor coupled to a first select line, a second select gate transistor, and second memory cells positioned between the first select gate transistor and the second select gate transistor;

a peripheral circuit coupled to the memory array and configured to perform a program operation to program the first memory string, wherein the program operation comprises:

performing, during a first loop of the program operation to program the first memory string, a first verification operation, wherein performing the first verification operation comprises:

during a first pre-pulse phase, applying, for a first duration, a first select voltage to the first select line; and performing, during a second loop of the program operation, a second verification operation, wherein performing the second verification operation comprises:

during a second pre-pulse phase, applying, for a second duration, the first select voltage to the first select line, wherein the second loop is after the first loop, and the second duration is shorter than the first duration.

2. The memory device of claim 1, wherein the first memory string is a selected memory string, the second memory string is an unselected memory string, the first select gate transistor is a drain select gate transistor, the second select gate transistor is a source select gate transistor, and the first select line is a drain select line.

3. The memory device of claim 1, wherein:

performing the first verification operation comprises:

during a first sense phase, verifying whether a first memory cell of the first memory cells is in a first programmed state, performing the second verification operation comprises:

during a second sense phase, verifying whether a second memory cell of the first memory cells is in a second programmed state, and the first programmed state is lower than the second programmed state.

4. The memory device of claim 3, wherein the program operation comprises:

performing, during a third loop of the program operation, a third verification operation, wherein performing the third verification operation comprises:

during a third pre-pulse phase, applying, for a third duration, the first select voltage to the first select line, wherein the third loop is after the second loop, and the third duration is shorter than the second duration.

5. The memory device of claim 4, wherein performing the third verification operation comprises:

during a third sense phase, verifying whether a third memory cell of the first memory cells is in a third programmed state, wherein the third programmed state is higher than the second programmed state.

6. The memory device of claim 5, wherein the first memory cells are triple-level cells programmable to one of seven programmed states P1, P2, P3, P4, P5, P6 and P7 in an ascending order, and wherein the first programmed state comprises at least one of P1, P2 or P3, the second programmed state comprises at least one of P4 or P5, and the third programmed state comprises at least one of P6 or P7.

7. The memory device of claim 3, wherein performing the first verification operation comprises:

in response to determining that the first programmed state is lower than a first threshold state, applying the first select voltage to the first select line for the first duration, and wherein performing the second verification operation comprises:

in response to determining that the second programmed state is higher than or equal to the first threshold state and lower than a second threshold state, applying the first select voltage to the first select line for the second duration.

8. The memory device of claim 3, wherein performing the second verification operation comprises:

after applying a first verify voltage to a first word line coupled to the second memory cell of the first memory cells, applying a second verify voltage to the first word line, wherein the second verify voltage is higher than the first verify voltage.

9. The memory device of claim 3, wherein performing the first verification operation comprises:

during the first sense phase, applying a ground voltage to the first select line.

10. The memory device of claim 3, wherein the first memory string comprises a third select gate transistor, a fourth select gate transistor, wherein the first memory cells are positioned between the third select gate transistor and the fourth select gate transistor, and wherein the first verification operation comprises:

during the first pre-pulse phase and the first sense phase, applying the first select voltage to a second select line coupled to the third select gate transistor of the first memory string.

11. The memory device of claim 10, wherein the second select gate transistor of the second memory string and the fourth select gate transistor of the first memory string are coupled to a third select line, wherein performing the first verification operation comprises:

during the first pre-pulse phase, applying a second select voltage to the third select line.

12. The memory device of claim 3, wherein performing the first verification operation comprises:

during the first pre-pulse phase and the first sense phase, applying a third verify voltage corresponding to the first programmed state to a second word line coupled to the first memory cell of the first memory cells.

13. The memory device of claim 1, wherein the program operation comprises:

performing, during a third loop of the program operation, a third verification operation without a pre-pulse phase before verifying whether a third memory cell of the first memory cells is in a third programmed state.

14. A method of operating a memory device, comprising:

performing, during a first loop of a program operation to program a first memory string comprising first memory cells, a first verification operation, wherein performing the first verification operation comprises:

during a first pre-pulse phase, applying, for a first duration, a select voltage to a first select line coupled to a first select gate transistor of a second memory string, wherein the second memory string comprises the first select gate transistor, a second select gate transistor, and second memory cells positioned between the first select gate transistor and the second select gate transistor; and performing, during a second loop of the program operation, a second verification operation, wherein performing the second verification operation comprises:

during a second pre-pulse phase, applying, for a second duration, the select voltage to the first select line, wherein the second loop is after the first loop, and the second duration is shorter than the first duration.

15. The method of claim 14, wherein:

performing the first verification operation comprises:

during a first sense phase, applying a first verification voltage to a first word line coupled to a first memory cell of the first memory cells, performing the second verification operation comprises:

during a second sense phase, applying a second verification voltage to a second word line coupled to a second memory cell of the first memory cells, and the first verification voltage is lower than the second verification voltage.

16. The method of claim 15, wherein:

performing the first verification operation comprises:

in response to determining that a first programmed state corresponding to the first verification voltage is lower than a first threshold state, applying the select voltage to the first select line for the first duration, and performing the second verification operation comprises:

in response to determining that a second programmed state corresponding to the second verification voltage is higher than or equal to the first threshold state and lower than a second threshold state, applying the select voltage to the first select line for the second duration.

17. The method of claim 15, comprising:

performing, during a third loop of the program operation, a third verification operation, wherein performing the third verification operation comprises:

during a third pre-pulse phase, applying, for a third duration, the select voltage to the first select line, wherein the third loop is after the second loop, and the third duration is shorter than the second duration.

18. The method of claim 17, wherein performing the third verification operation comprises:

during a third sense phase, applying a third verification voltage to a third word line coupled to a third memory cell of the first memory cells, wherein the third verification voltage is higher than the second verification voltage.

19. The method of claim 15, comprising:

performing, during a third loop of the program operation, a third verification operation without a pre-pulse phase before a third sense phase.

20. A memory system, comprising:

a memory device, comprising:

a memory array comprising:

a first memory string comprising first memory cells; and a second memory string comprising a first select gate transistor coupled to a first select line, a second select gate transistor, and second memory cells positioned between the first select gate transistor and the second select gate transistor;

a peripheral circuit coupled to the memory array and configured to perform operations comprising:

performing, during a first loop of a program operation to program the first memory string, a first verification operation, wherein performing the first verification operation comprises:

during a first pre-pulse phase, applying, for a first duration, a select voltage to the first select line; and performing, during a second loop of the program operation, a second verification operation, wherein the second verification operation comprises:

during a second pre-pulse phase, applying, fora second duration, the select voltage to the first select line, wherein the second loop is after the first loop, and the second duration is shorter than the first duration; and a controller coupled to the memory device and configured to send signals to the memory device.

* * * * *